(12) United States Patent
Jeon et al.

(10) Patent No.: US 6,337,174 B1
(45) Date of Patent: Jan. 8, 2002

(54) METHOD OF STRIPPING A PHOTORESIST FROM A SEMICONDUCTOR SUBSTRATE DIMETHYLACETAMIDE OR A COMBINATION OF MONOETHANOLAMINE AND DIMETHYLSULFOXIDE

(75) Inventors: Mi-sook Jeon; Chun-deuk Lee; June-ing Gil; Pil-kwon Jun, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/428,917

(22) Filed: Oct. 28, 1999

Related U.S. Application Data

(62) Division of application No. 09/154,781, filed on Sep. 17, 1998, now Pat. No. 6,207,358.

(51) Int. Cl.$^7$ .................................................. G03C 5/00
(52) U.S. Cl. ........................ 430/313; 430/329; 134/1.3
(58) Field of Search ................................ 430/313, 329, 430/331; 134/1.3

(56) References Cited

U.S. PATENT DOCUMENTS

| 5,988,186 A | * 11/1999 | Ward .......................... 134/1.3 |
| 6,140,027 A | * 11/1999 | Baik .......................... 430/331 |

* cited by examiner

Primary Examiner—Kathleen Duda
(74) Attorney, Agent, or Firm—Volentine Francos, PLLC

(57) ABSTRACT

In the fabrication of semiconductor devices, a method of forming a fine pattern on a semiconductor substrate includes the steps of exposing and developing a photoresist deposited on a film of a semiconductor substrate in order to remove selected portions of the photoresist, etching portions of the film left exposed when the selected portions of the photoresist are removed, and subsequently removing any of the photoresist remaining on the semiconductor substrate with dimethylacetamide, or a combination of monoethanolamine and dimethylsulfoxide. Such stripping solutions are capable of removing photoresists in the Deep-UV group as well as the conventionally used photoresists in the I-line group.

23 Claims, 3 Drawing Sheets

METHOD OF STRIPPING A PHOTORESIST
FROM A SEMICONDUCTOR SUBSTRATE
DIMETHYLACETAMIDE OR A
COMBINATION OF MONOETHANOLAMINE
AND DIMETHYLSULFOXIDE

CROSS REFERENCE TO RELATED
APPLICATIONS

This is a divisional application of application Ser. No. 09/154,781, filed Sep. 17, 1998 now U.S. Pat. No. 6,207, 358, which is hereby incorporated by reference in its entirety for all purposes.

BACKGROUND OF THE INVENTION

1. Field of the Invention

The present invention relates to a method of manufacturing semiconductor devices. More particularly, the present invention relates to a process of stripping photoresist from a semiconductor wafer using a solution of dimethylacetamide or a solution of monoethanolamine and dimethylsulfoxide.

2. Description of the Related Art

In general, the fabricating of semiconductor devices involves the use of photolithography for forming a pattern on a semiconductor wafer.

In photolithography, a photoresist deposited on the semiconductor wafer is selectively removed in a series of processing steps, such as an exposure step, a development step, etc. A pattern designed according to the desired characteristics of the semiconductor device is formed on the semiconductor wafer using the photoresist as a mask.

Photoresists can be classified into two groups: positive photoresists and negative photoresists. Whether a photoresist is considered to be of a positive type or of a negative type depends on the region thereof which is removed after selected portions of the photoresist are irradiated during the exposure process.

That is, the positive type of photoresist is one in which the exposed regions of the photoresist are removed from the semiconductor substrate. The negative type of photoresist is one in which the non-exposed regions of the photoresist are removed from the semiconductor substrate.

On the other hand, photoresists can also be classified according to the wavelength at which the photoresist responds with respect to its exposure and development. Photoresists classified in this way include those of the I-line group, the G-line group, and the Deep-UV group.

When an Hg-Arc lamp is used as the general light source in the semiconductor device manufacturing process, photoresists are classified in the I-line group, G-line and Deep-UV according to the wavelength of light from the spectrum of the Hg-Arc lamp. More specifically, a photoresist in the I-line group responds to light having a wavelength of 365 nm. A photoresist in the G-line group responds to light having a wavelength of 436 nm, and a photoresist in the Deep-UV group responds to light having a wavelength of 248 nm.

In a conventional semiconductor device fabrication process, a positive photoresist in the I-line group is normally used. That is, the regions of a photoresist exposed to light having a wavelength of 365 nm are selectively removed from the semiconductor substrate.

However, photolithography using a positive photoresist in the I-line group has its limits. In particular, such a process can only form a pattern as small as 0.3 $\mu$m. Such a process, therefore, is not suitable for manufacturing the highly miniaturized semiconductor devices which are now in demand.

Accordingly, recent semiconductor device fabrication processes employ photoresists in the Deep-UV group. These photoresists can be used to form patterns smaller than even 0.2 $\mu$m.

However, photoresists in the Deep-UV are inferior to those in the I-line group in terms of their resistance to light and heat. This is because the constituents of the photoresists in the I-line group and the photoresists in the Deep-UV group, such as the polymer component, the light-reactant, and the solvent, are different from each other.

In fact, photoresists in the Deep-UV group are not widely used in semiconductor device fabrication because no chemical has yet been developed which can completely remove a Deep-UV group photoresist remaining on a semiconductor substrate after the photolithography has been completed.

SUMMARY OF THE INVENTION

An object of the present invention, therefore, is to provide a semiconductor device fabrication method including a process in which a Deep-UV group photoresist can be completely removed from the semiconductor substrate.

Another object of the present invention is to provide a semiconductor device fabrication method including a process which is so flexible that it can be used to completely remove either a Deep-UV group photoresist or an I-group photoresist from a semiconductor substrate.

To achieve these and other objects and advantages, the present invention is characterized in that it uses only dimethylacetamide to strip any remaining photoresist from the semiconductor substrate after the exposure and development steps of the photolithography process are carried out.

The present inventors have found that dimethylacetamide can remove either a positive photoresist in the Deep-UV group or a positive photoresist in the I-line group. The photoresist is typically formed on a film, such as an insulating film, a metallic film, or a multilayered-film comprising an insulating layer and a metallic layer.

Preferably, the stripping process is carried out for less than 300 sec. while the dimethylacetamide is maintained at about 10° C. to 40° C. In addition, the stripping process is preferably carried out by spraying the dimethylacetamide onto the photoresist.

The method further comprises a step of baking the photoresist before the photoresist is exposed. The baking step is preferably carried out at a temperature below 200° C. for less than 300 seconds.

To also achieve the above-described and other objects and advantages, another embodiment of the present invention is characterized in that it uses a mixture of monoethanolamine and dimethylsulfoxide to strip any remaining photoresist from the semiconductor substrate after the exposure and development steps of the photolithography process are carried out.

The mixture is preferably 20 to 80 weight % monoethanolamine with the remainder being the dimethylsulfoxide.

The present inventors have found out that such a mixture of monoethanolamine and dimethylsulfoxide can remove either a positive or negative photoresist in the Deep-UV group, as well as either a positive or negative photoresist in the I-line group.

The monoethanolamine and dimethylacetamide are maintained at a temperature of about 10° C. to 40° C. while they are sprayed on the semiconductor substrate. Preferably, the monoethanolamine and the dimethylsulfoxide are sprayed separately onto the photoresist where they mix.

In addition to the baking step mentioned above, the process also includes a step of rinsing the semiconductor substrate once the photoresist has been removed therefrom by the monoethanolamine and the dimethylsulfoxide.

The rinsing is preferably carried out for less than 120 sec. at a temperature of about 10° C. to 40° C. The rinsing may be carried out using deionized water or acetone.

BRIEF DESCRIPTION OF THE DRAWINGS

These and other objects, features and advantages of the present invention will become more apparent from the following detailed description of preferred embodiments thereof made with reference to the accompanying drawings, of which.

DETAILED DESCRIPTION OF THE PREFERRED EMBODIMENTS

The preferred embodiments of the present invention will now be described in detail with reference to the accompanying drawings. Before this proceeds, however, it is to be noted that throughout this disclosure the term "semiconductor substrate" is used. Such a term is to be understood as referring to both the substrate per se and a substrate on which a film(s) has been formed.

First Embodiment

Figure 1:
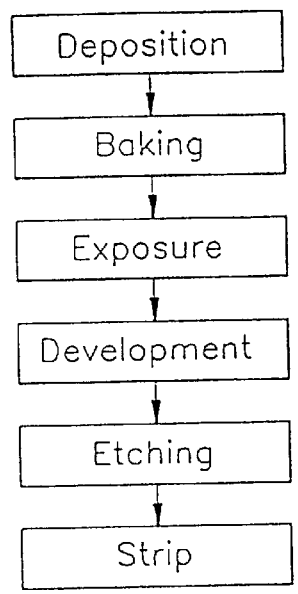
FIG. 1 is a block diagram of one embodiment of the semiconductor device fabrication method according to the present invention.

FIG. 1 shows the sequence of steps in a first embodiment of a method of forming a pattern on a semiconductor substrate according to the present invention.

More specifically, the method includes the steps of depositing photoresist on a semiconductor substrate, baking the photoresist, exposing the photoresist to light having a certain wavelength, removing selected portions of the photoresist, etching a portion of the product, e.g. a film, left exposed by the removal of the selected portions of the photoresist, and completely removing any photoresist remaining on the semiconductor substrate.

The photoresist can be a positive photoresist in the I-line group, wherein a predetermined portion thereof is removed by light having a wavelength of 365 nm, or a positive type of photoresist in the Deep-UV group, wherein a predetermined portion thereof is removed by light having a wavelength of 248 nm.

In either case, dimethylacetamide is used for completely removing the photoresist from the substrate.

EXAMPLE 1

In this example, a positive photoresist in the Deep-UV group (product name: UV III, manufacturer: SHIPLY) is used.

First, the photoresist is deposited over a film disposed on a semiconductor substrate. The film can be an insulating film, a metallic film, or multi-layered film including both an insulating layer and a metallic layer. The photoresist is deposited on the film by a spray type of spin-coater 10 shown in FIG. 2. In this device, a semiconductor substrate W is rotated while the photoresist is sprayed thereon through a nozzle 12.

Then, the solvent component of the photoresist deposited on the semiconductor substrate is removed, and the photoresist is baked in order to stabilize the photoresist. The photoresist is baked at a temperature below 200° C. and for less than 300 sec. In this example, the photoresist is baked at a temperature of 100° C. for 120 sec.

Next, selected portions of the photoresist are exposed to light having a wavelength of 248 nm. The photoresist can be exposed using a step-by-step technique or a scanning technique.

Then, the photoresist is developed to remove the portion of the photoresist exposed to the light. Subsequently, the underlying film now exposed by the selective removal of the photoresist is etched.

Next, a stripping process is carried out. The stripping process completely removes any photoresist remaining on the semiconductor substrate after the developing step. According to the first embodiment of the present invention, the stripping process is carried out by subjecting the remaining photoresist to dimethylacetamide at a temperature of 10 to 40° C. and for less than 300 sec. In the first example, the stripping process is carried out at a temperature of 25° C, for 180 sec.

Figure 2:
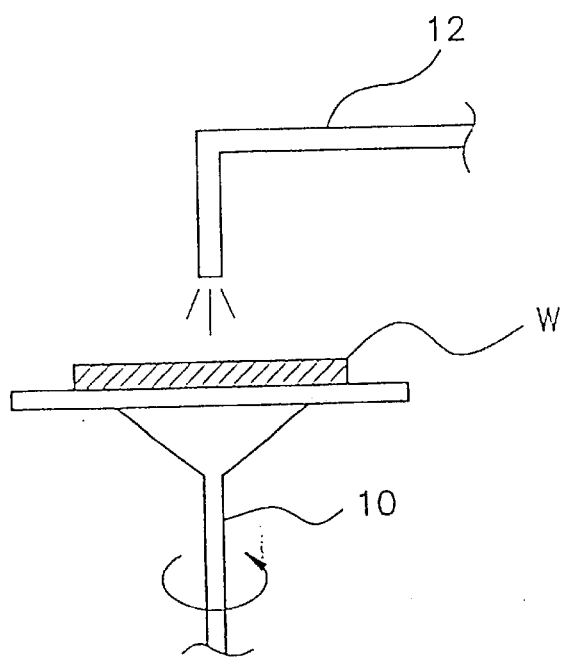
FIG. 2 is a schematic diagram of a spin-coater for carrying out the method depicted in FIG. 1.

In addition, the stripping process is executed by the spray type of spin-coater 10 shown in FIG. 2. That is, the dimethylacetamide is sprayed onto the remaining photoresist from the nozzle 12 of the spin-coater 10.

EXAMPLE 2

In the second example, a positive photoresist in the I-line group (product name: THMR i3100) is used. Accordingly, the photoresist is irradiated with light having a wavelength of 365 nm during the exposure step. After the photolithography process is completed in the manner described above in connection with the first example, the remaining photoresist is completely removed with dimethylacetamide.

In the first embodiment of the present invention, dimethylacetamide is used for removing the-photoresist remaining on the substrate after the photolithography is completed. Because dimethylacetamide will remove photoresists in both the I-line group and the Deep-UV group, the semiconductor device fabrication line can manufacture various devices using the photoresist best suited for making the pattern of the device. That is, the photoresist can be selected according to the type of pattern to be produced.

In addition, because the stripping step is executed by the spin-coater 10, the method of the present invention eliminates the standby-time required in the conventional method in which $H_2SO_4$ is used to strip the photoresist. Accordingly, the present invention is more efficient than the conventional process.

Still further, dimethylacetamide affects the underlying layer, i.e. the insulating, metallic or multi-layered film, less than sulfuric acid.

Second Embodiment

Figure 3:
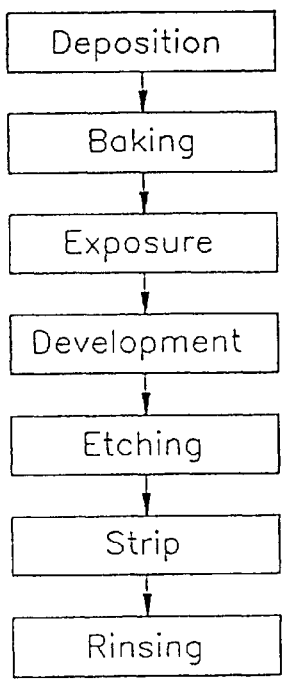
FIG. 3 is a block diagram of another embodiment of a semiconductor device fabrication method according to the present invention.

FIG. 3 shows the sequence of steps in a second embodiment of a method of forming a pattern on a semiconductor substrate according to the present invention.

More specifically, the method includes the steps of depositing photoresist on a semiconductor substrate, baking the photoresist, exposing the photoresist to light having a certain wavelength, removing selected portions of the photoresist, etching a portion of the product, e.g. a film, left exposed by the removal of the selected portions of the photoresist, completely removing any photoresist remaining on the semiconductor substrate, and rinsing the semiconductor substrate.

In this embodiment, the photoresist can be a positive photoresist in the I-line group, wherein a predetermined portion thereof is selectively removed by light having a wavelength of 365 nm, a positive photoresist in the Deep-UV group, wherein a predetermined portion thereof is selectively removed by light having a wavelength of 248 nm, or a negative photoresist in the Deep-UV group.

In any case, a mixture of monoethanolamine and dimethylsulfoxide is used for completely removing the photoresist from the substrate. The mixture is 20 to 80 weight percent monoethanolamine with the remainder being the dimethylsulfoxide. Preferably, the solution is 60 weight percent monoethanolamine and 40 weight percent dimethylsulfoxide.

FIRST EXAMPLE

In the first example of the second embodiment, a positive photoresist in the Deep-UV group (product name: UV III) is used.

First, the photoresist is deposited over a film disposed on a semiconductor substrate. The film can be an insulating film, a metallic film, or multi-layered film including both an insulating layer and a metallic layer. The photoresist is deposited on the film by a spray type of spin-coater 10 shown in FIG. 4. In this device, a semiconductor substrate W is rotated while the photoresist is sprayed thereon through one of the nozzles 12.

Then, the solvent component of the photoresist deposited on the semiconductor substrate is removed, and the photoresist is baked in order is to stabilize the photoresist. The photoresist is baked at a temperature of up to 200° C. and for less than 300 sec. In this example, the photoresist is baked at a temperature of 100° C. for 120 sec.

Next, selected portions of the photoresist are exposed to light having a wavelength of 248 nm. The photoresist can be exposed using a step-by-step technique or a scanning technique.

Then, the photoresist is developed to remove the portion of the photoresist exposed to the light. Subsequently, the underlying film now exposed by the selective removal of the photoresist is etched.

Next, a stripping process is carried out. The stripping process completely removes any photoresist remaining on the semiconductor substrate after the development step. According to the second embodiment of the present invention, the stripping process is carried out by subjecting the remaining photoresist to a solution of monoethanolamine and dimethylsulfoxide at a temperature of about 10° C. to 40° C.

In this example, the solution is maintained at a temperature of 25° C. and the stripping process is carried out for 180 sec. The solution is actually formed by the spin-coater 10 shown in FIG. 4. In this device, the monoethanolamine and the dimethylsulfoxide are sprayed onto the photoresist through nozzles 12, respectively.

Next, the semiconductor substrate is rinsed. The rinsing process removes any of the stripping solution remaining on the semiconductor substrate and is developed based on the viscosity of the stripping solution. In addition, the rinsing process of the present invention is carried out for 120 sec. at a temperature of 10 to 40° C. In this example, the semiconductor substrate is rinsed for 60 sec. at a temperature of 25° C.

In particular, the semiconductor substrate is rinsed with deionized water or acetone. However, ethylpyruvate, tetrahydrofurane, propyleneglycolmonoethylacetate, T-butyrolacetone, N-methyl-2-pyrollidone, N-butylacetate, or a mixture of these chemicals can be used as the rinse instead of deionized water or acetone.

Figure 4:
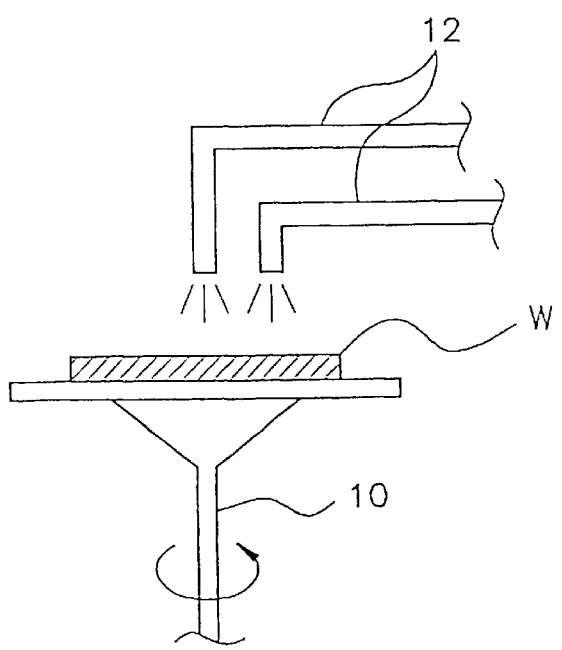
FIG. 4 is a schematic diagram of a spin-coater for carrying out the method depicted in FIG. 3.

The rinsing process is also performed by the spin-coater 10 shown in FIG. 4. That is, the chemical(s) used in the rinsing process are sprayed onto the semiconductor substrate through the nozzle(s) 12.

EXAMPLE 2

In this example, a negative photoresist in the Deep-UV group (product name: TDUR-N908) is used. Accordingly, the portion thereof that is exposed to light is allowed to remain on the semiconductor substrate.

All other steps are essentially the same as those described above with respect to the first example.

THIRD EXAMPLE

In this example, a positive photoresist in the I-line group (product name: THMR i3100, manufacturer: TOK) is used. Accordingly, in the development step, the photoresist is exposed to light having a wavelength of 365.

Again, all other steps are essentially the same as those described above with respect to the first example.

In the second embodiment of the present invention, a mixture of monoethanolamine and dimethylsulfoxide is used for removing the photoresist remaining on the substrate after the photolithography is completed. Because a mixture of monoethanolamine and dimethylsulfoxide will remove positive and negative photoresists in both the I-line group and the Deep-UV group, the semiconductor device fabrication line can manufacture various devices using the photoresist best suited for making the pattern of the device. That is, the photoresist can be selected according to the type of pattern to be produced.

In addition, because the stripping step is executed by the spin-coater 10, the method of the present invention does not require the standby-time required in the conventional method in which $H_2SO_4$ is used to strip the photoresist. Accordingly, the present invention is more efficient than the conventional process.

Still further, a mixture of monoethanolamine and dimethylsulfoxide affects the underlying film less than conventional sulfuric acid.

Figure 5:
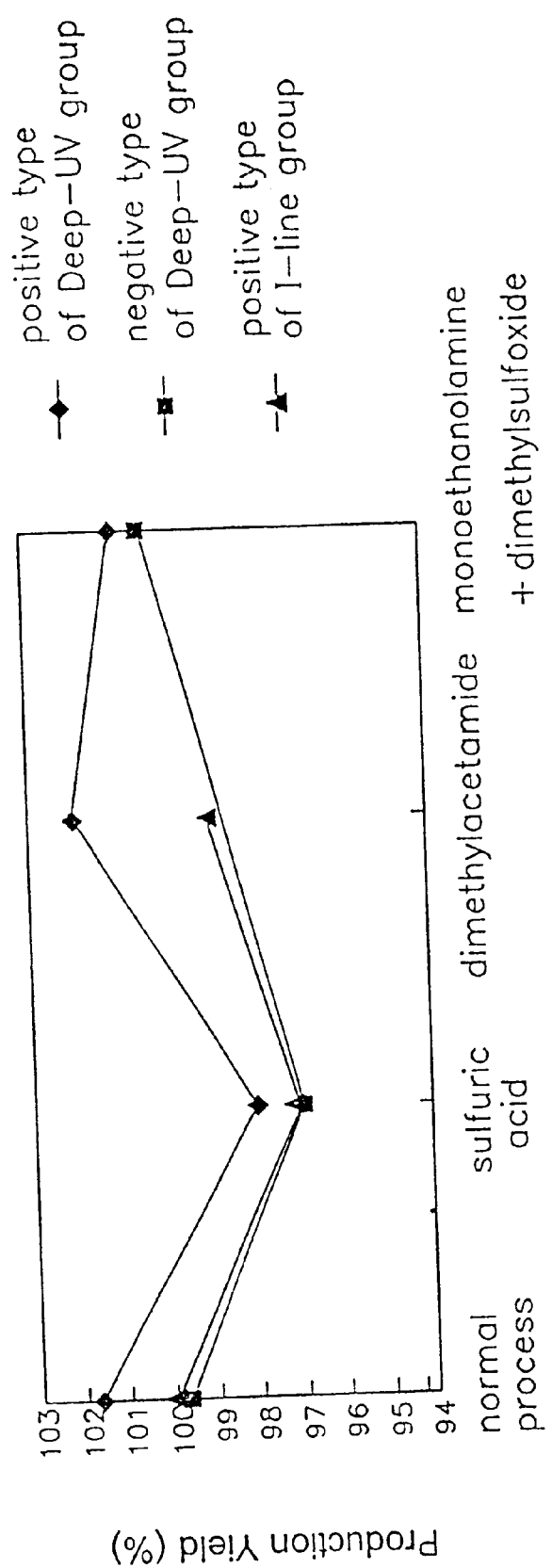
FIG. 5 is a graphical representation of the production yield of semiconductor devices manufactured using the method of the present invention.

The production yield (%) of semiconductor devices produced according to the first and the second embodiments of the present invention are shown in the graph of FIG. 5.

As is quite clear from this graph, using dimethylacetamide, or a mixture of monoethanolamine and dimethylsulfoxide to remove photoresist after photolithography provides better results than using sulfuric acid to do the same.

The present invention, as described above, allows various types of photoresists to be used during the semiconductor device manufacturing process. Because these photoresists include those in the Deep-UV group, fine patterns having a size of less than 0.2 µm can be produced. Accordingly, the present invention can be used to meet the current demand for miniature semiconductor devices.

Finally, if the spin-coater 10 employs a suitable number of nozzles, e.g. three nozzles, the photoresist, stripping solution, and rinsing solution can be respectively sprayed onto the substrate without the need for stand-by time. Accordingly, the present invention is very efficient in terms of saving time.

The stripping solutions of the present invention may be used for both normal photoresist removal processes and for abnormal (or "rework") photoresist removal processes. A normal process refers to removing photoresist remaining after a normal etching process. An abnormal or rework process refers to removing photoresist after a photoresist failure, exposure failure, or photoresist pattern alignment failure occurring in a photolithography process before the etching process. The stripping solutions of the present invention are especially effective in the rework process.

Although the present invention has been described in detail above, various changes, substitutions and alterations thereto will become apparent to those of ordinary skill in the art. All such changes, substitutions and alterations are seen to be within the true spirit and scope of the invention as defined by the appended claims.

What is claimed is:

1. In the fabrication of semiconductor devices, a method of forming a pattern on a semiconductor substrate, said method comprising:
    depositing a photoresist over a semiconductor substrate;
    exposing regions of the photoresist to light;
    removing selected portions of the photoresist;
    etching surface portions of the substrate left exposed by the removal of the selected portions of the photoresist; and
    subsequently subjecting portions of the photoresist remaining over the semiconductor substrate to a mixture consisting of monoethanolamine and dimethylsulfoxide to completely remove the photoresist from the semiconductor.

2. The method of claim 1, wherein the mixture subjected to the portions of the photoresist is 20 to 80 weight % of the monoethanolamine.

3. The method of claim 1, wherein said removing selected portions of the photoresist comprises removing the regions of the photoresist exposed to the light.

4. The method of claim 3, wherein said depositing a photoresist comprises depositing a photoresist selected from an I-line responsive group.

5. The method of claim 3, wherein said depositing a photoresist comprises depositing a photoresist selected from a Deep-UV responsive group.

6. The method of claim 1, wherein said removing a photoresist comprises removing portions of the photoresist other than those exposed to the light.

7. The method of claim 6, wherein said depositing a photoresist comprises depositing a photoresist selected from an I-line responsive group.

8. The method of claim 6, wherein said said depositing a photoresist comprises depositing a photoresist selected from a Deep-UV responsive group.

9. The method of claim 1, wherein the portions of the photoresist are subjected to the mixture consisting of monoethanolamine and dimethylsulfoxide for less than 300 seconds with a temperature of the mixture being maintained within a range of 10° C. to 40° C.

10. The method of claim 1, wherein said subjecting portions of the photoresist to the mixture consisting of monoethanolamine and dimethylsulfoxide comprises spraying the monoethanolamine and the dimethylsulfoxide toward the semiconductor substrate having the photoresist deposited thereon.

11. The method of claim 10, wherein the monoethanolamine and the dimethylsulfoxide are sprayed separately toward the semiconductor substrate having the photoresist deposited thereon.

12. In the fabrication of semiconductor devices, a method of forming a pattern on a semiconductor substrate, said method comprising:
    providing a semiconductor substrate having a film at the surface thereof;
    depositing a photoresist on the film;
    exposing regions of the photoresist to light;
    developing the photoresist exposed to light to remove selected portions of the photoresist from the film and thereby expose portions of the film;
    etching the exposed portions of the film; and
    subsequently subjecting portions of the photoresist remaining on the film to a mixture consisting of monoethanolamine and dimethylsulfoxide.

13. The method of claim 12, further comprising baking the photoresist before the photoresist is exposed to the light.

14. The method of claim 13, wherein said baking is carried out at a temperature below 200° C. for less than 300 sec.

15. The method of claim 12, further comprising rinsing the semiconductor substrate from which the photoresist has been removed.

16. The method of claim 15, wherein said rinsing is carried out for less than 120 sec. at a temperature of 10° C. to 40° C.

17. The method of claim 16, wherein said rinsing comprises subjecting the semiconductor substrate to a rinse selected from the group consisting of deionized water and acetone.

18. The method of claim 12, wherein said developing the photoresist comprises removing the regions of the photoresist exposed to the light, and said depositing the photoresist comprises depositing a photoresist selected from an I-line responsive group.

19. The method of claim 12, wherein said developing the photoresist comprises removing the regions of the photoresist exposed to the light, and said depositing the photoresist comprises depositing a photoresist selected from a Deep-UV responsive group.

20. The method of claim 12, wherein said developing the photoresist comprises removing portions of the photoresist other than those exposed to the light, and said depositing the photoresist comprises depositing a photoresist selected from an I-line responsive group.

21. The method of claim 12, wherein said developing the photoresist comprises removing portions of the photoresist other than those exposed to the light, and said depositing the photoresist comprises depositing a photoresist selected from a Deep-UV responsive group.

22. The method of claim 12, wherein the portions of the photoresist are subjected to the mixture consisting of monoethanolamine and dimethylsulfoxide for less than 300 seconds with a temperature of the mixture being maintained within a range of 10° C. to 40° C.

23. The fabrication method of claim 12, wherein the monoethanolamine and the dimethylsulfoxide are sprayed separately toward the semiconductor substrate having the photoresist deposited thereon.

\* \* \* \* \*